US008102954B2

(12) United States Patent (10) Patent No.: US 8,102,954 B2
Coumou (45) Date of Patent: Jan. 24, 2012

(54) FREQUENCY INTERFERENCE DETECTION AND CORRECTION

(75) Inventor: David J. Coumou, Webster, NY (US)

(73) Assignee: MKS Instruments, Inc., Andover, MA (US)

(\*) Notice: Subject to any disclaimer, the term of this patent is extended or adjusted under 35 U.S.C. 154(b) by 1390 days.

(21) Appl. No.: 11/115,063

(22) Filed: Apr. 26, 2005

(65) Prior Publication Data

US 2006/0239389 A1 Oct. 26, 2006

(51) Int. Cl.
*H03D 1/04* (2006.01)
(52) U.S. Cl. ........ 375/346; 375/348; 375/320; 375/268; 375/278; 375/284; 375/296
(58) Field of Classification Search .................. 375/346, 375/348, 320, 268, 278, 284, 296, 384; 455/114.3, 455/127.1, 77, 84, 67.11, 259, 500, 131, 455/63.1; 341/118, 142, 127, 120, 22, 143
See application file for complete search history.

(56) References Cited

U.S. PATENT DOCUMENTS

| 5,175,472 | A | | 12/1992 | Johnson, Jr. et al. | |
|---|---|---|---|---|---|
| 5,386,241 | A | * | 1/1995 | Park | 348/565 |
| 5,565,737 | A | | 10/1996 | Keane | |
| 5,834,931 | A | | 11/1998 | Moore et al. | |
| 5,867,020 | A | | 2/1999 | Moore et al. | |
| 5,910,906 | A | * | 6/1999 | Schmitt | 708/312 |
| 5,920,840 | A | * | 7/1999 | Satyamurti et al. | 704/267 |
| 6,020,794 | A | | 2/2000 | Wilbur | |
| 6,046,594 | A | | 4/2000 | Mavretic | |
| 6,061,006 | A | | 5/2000 | Hopkins | |
| 6,449,568 | B1 | | 9/2002 | Gerrish | |
| 6,469,488 | B1 | * | 10/2002 | Hopkins et al. | 324/76.21 |
| 6,522,121 | B2 | | 2/2003 | Coumou | |
| 6,707,255 | B2 | | 3/2004 | Coumou et al. | |
| 2001/0052864 | A1 | * | 12/2001 | Shimizu et al. | 341/141 |
| 2002/0080898 | A1 | * | 6/2002 | Agazzi et al. | 375/355 |
| 2004/0161062 | A1 | * | 8/2004 | Richey et al. | 375/344 |

OTHER PUBLICATIONS

H. Nyquist; "Certain Topics in Telegraph Tarnsmission Theory" Transaction AIEE; vol. 47; Apr. 1928; p. 617-644.
C.E. Shannon; "Communication in the Presence of Noise"; Proc. IRE; Jan. 1949; p. 10-21.

\* cited by examiner

*Primary Examiner* — Kabir A Timory
(74) *Attorney, Agent, or Firm* — Harness, Dickey & Pierce, P.L.C.

(57) ABSTRACT

A system for detecting and correcting for spurious frequencies that may coincide in a bandwidth of interest in an RF metrology system. The system can (1) utilize a deterministic scheme to detect an interference by a spurious frequency and correct the distortion effect or (2) utilize a mixed signal processing architecture to avoid the occurrence of spurious frequency contamination. A detection scheme identifies the event of distortion and triggers either (a) a shift in the analog to digital convert sample rate or (b) a mathematical vector manipulation. The shift of the analog to digital convert sample rate moves an aliased image of the spurious frequency outside of the frequency of interest. The mathematical vector correction removes the distortion and restores the signal of interest.

6 Claims, 11 Drawing Sheets

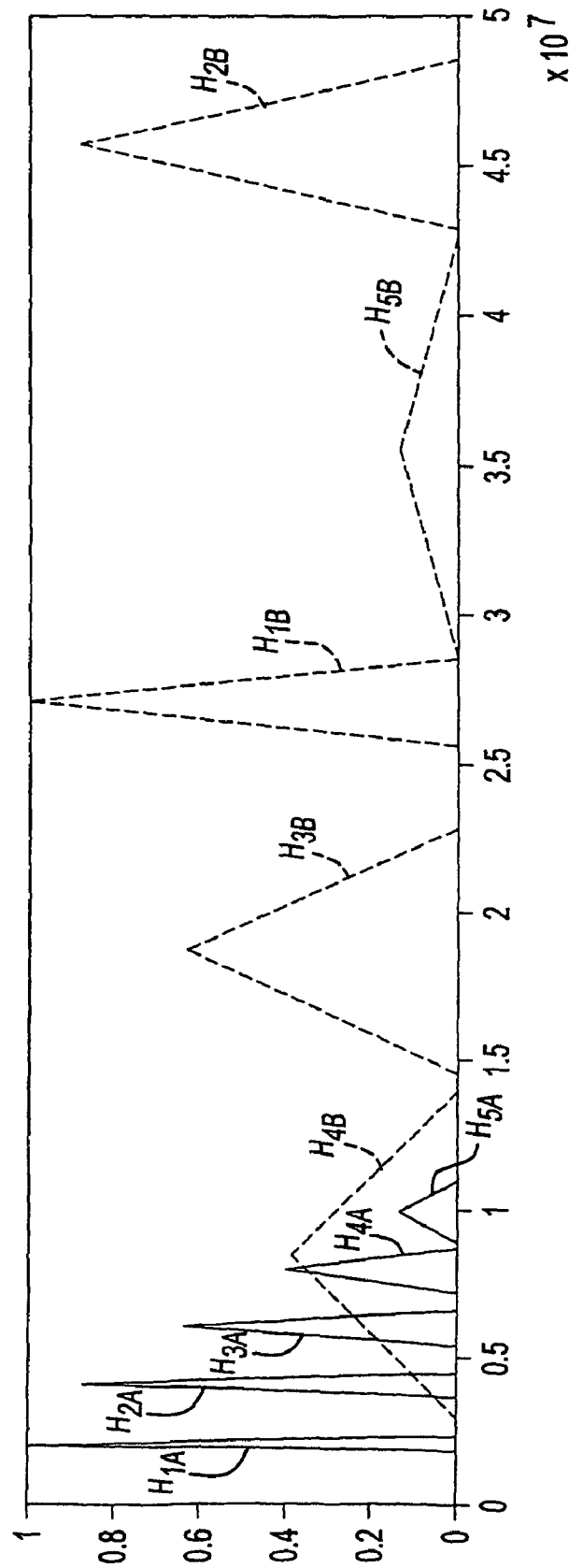
*Fig-1* --Prior Art--

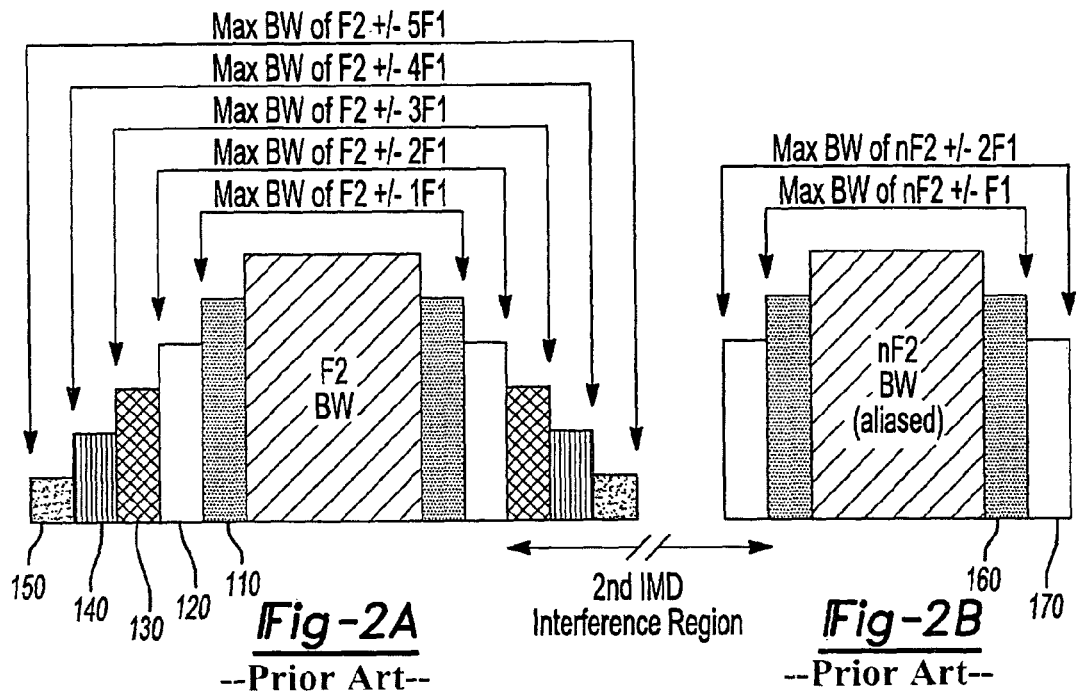
Fig-2A
--Prior Art--
Fig-2B
--Prior Art--
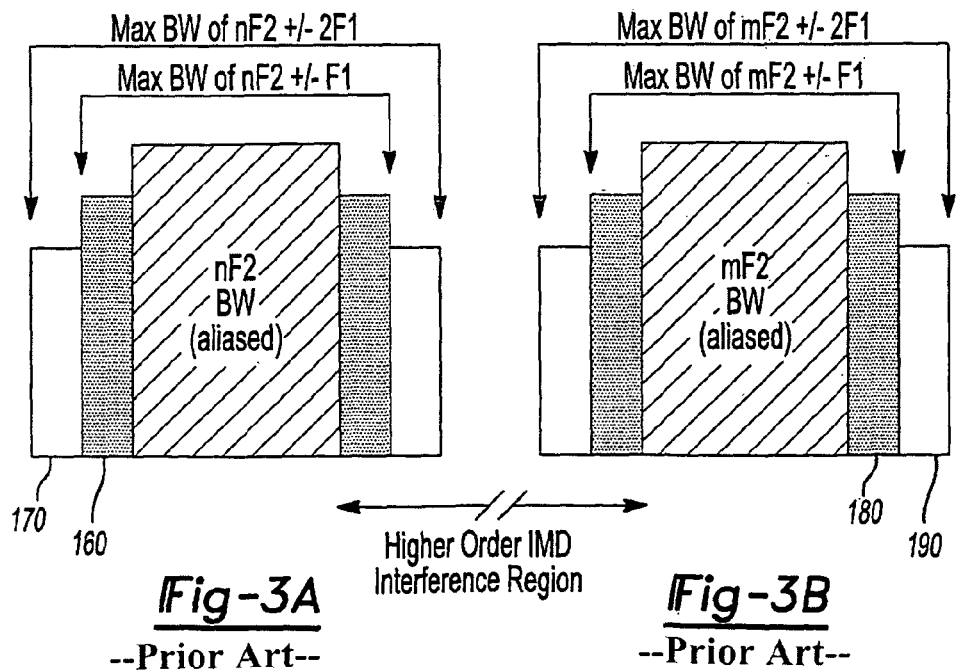
Fig-3A
--Prior Art--
Fig-3B
--Prior Art--

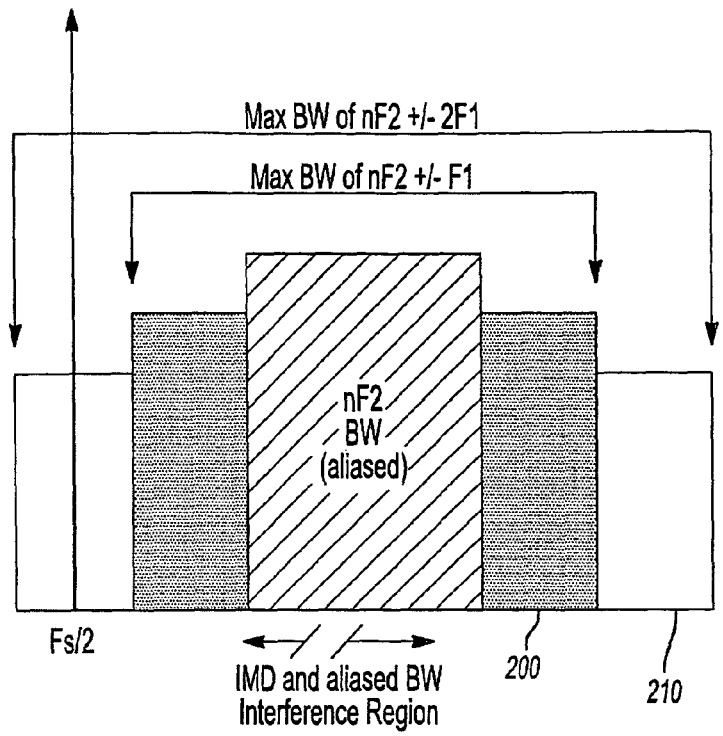
*Fig-4* --Prior Art--
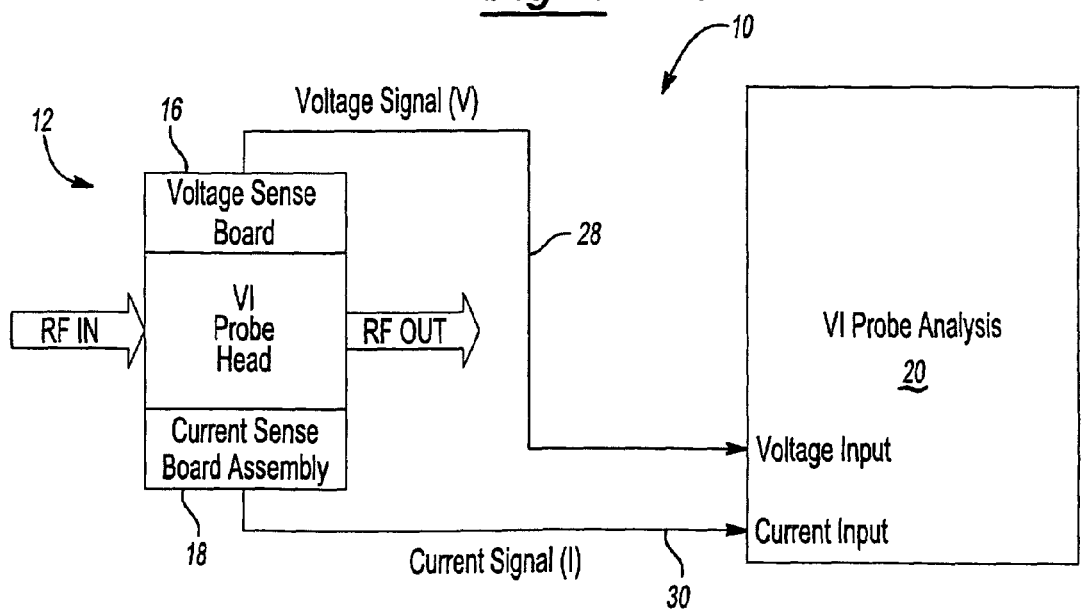
*Fig-5*

ADC Clock Timing Diagram

FREQUENCY INTERFERENCE DETECTION AND CORRECTION

TECHNICAL FIELD

The present invention generally relates to plasma control systems, and more particularly, to preventing or alleviating distorted signals.

BACKGROUND

Plasma etching is frequently used in semiconductor fabrication. In plasma etching, ions are accelerated by an electric field to etch exposed surfaces on a substrate. Broadband sampling is used to monitor the RF Metrology used plasma process chamber. During sampling, aliasing can occur when a sample rate of an analog/digital converter (ADC) is less than half the frequency of a sampled signal. This causes frequencies that exceed half the sampling rate of the analog/digital converter to fold over in the digital frequency domain and appear as lower or aliased frequencies. FIG. 1 depicts aliased frequency bands in a radio frequency (RF) spectrum of a dual frequency system. The dual frequency system includes a high (such as 25.6 MHz) and a low (such as 2 MHz) frequency RF source. The low frequency RF source (F1) is represented by a fundamental harmonic $H_{1A}$ and its associated harmonics $H_{2A}$ through $H_{5A}$. For illustrative purposes only, each of the associated harmonics have peaks that incrementally descend after $H_{1A}$. The high frequency RF source (F2) is represented by the fundamental harmonic $H_{1B}$ and its associated harmonics $H_{2B}$ through $H_{5B}$. Harmonics $H_{2B}$ through $H_{5B}$ do not proportionally decrease in frequency as compared to the harmonics for the lower frequency RF source, $H_{1B}$. This disproportionate decrease in frequency can be generally referred to as aliasing.

Signal distortions such as intermodulation distortion (IMD) corrupt aliased frequencies, thereby creating in-band interference. IMD occurs when two or more signals pass through a non-linear system. Energy contained in the input signal of a non-linear system is transformed at its output. The output includes a set of frequency components at the original frequencies along with additional components at new frequencies that were not contained in the input signal.

There are at least three scenarios of in-band interference that may occur during broadband sampling for monitoring of a plasma process. FIGS. 2A-2B depict a first scenario in which the IMD around a fundamental frequency bandwidth F2 coincides with a spectrally folded bandwidth (BW) of interest. FIG. 2A is a block diagram of five bandwidth regions 110, 120, 130, 140, 150 in which signal distortion has not yet occurred with respect to the bandwidth of F2. The bandwidths for the first region 110, the second region 120, third region 130, fourth region 140, and fifth region 150 depend upon the bandwidth of an unaliased frequency F2. These bandwidth regions can be determined using the equation associated with the arrows defining the boundaries for each region shown in FIG. 2A.

FIG. 2B is a block diagram of IMD interference regions 160, 170 that occur around the aliased fundamental frequency nF2 bandwidth, where "n" is an integer constant. As F2 changes, nF2 and the IMD products correspondingly change. Due to the ADC sample rate, the IMD products and nF2 can co-exist in the digital domain with F2 bandwidth, thereby causing an interference or spurious frequencies. Spurious frequencies are unwanted and non-harmonically related signals. The bandwidth regions can be determined using the equations associated with the arrows defining the boundaries for each region shown in FIG. 2B.

FIGS. 3A-3B depict a second scenario of band interference in which higher order IMD regions occur. In this example, the fringes of the spectrally folded bandwidth of interest are adjacent to, but do not crossover or coincide. FIG. 3A depicts a block diagram of IMD interference regions 160,170 that occur around the aliased fundamental frequency nF2 bandwidth and overlap mF2. When overlapping mF2, there is a probability that the IMD interference regions 160, 170 may coincide with the bandwidth of interest. FIG. 3B is a block diagram of IMD interference regions that occur around the aliased fundamental frequency mF2 bandwidth, where "m" is an integer constant. As F2 changes, mF2 and the IMD products correspondingly change. The bandwidth regions can be determined using the equations associated with the arrows defining the boundaries for each region shown in FIG. 2B. Similar to regions 160 and 170, regions 180 and 190 can overlap, in this example, mF2. When overlapping mF2, there is a probability that at least one of the IMD regions 180, 190 may coincide with the bandwidth of interest.

FIG. 4 depicts a third scenario of band interference that involves IMD and an aliased bandwidth interference region. In this example, bandwidth region 200 lies adjacent to bandwidth region 210. The bandwidth regions can be determined using the equations associated with the arrows defining the boundaries for each region shown in FIG. 4. Half the sampling frequency ($F_s/2$), commonly referred to as the Nyquist frequency, occurs in bandwidth region 200 or 210. Specifically, the Nyquist frequency occurs at a region associated with the formula nF2−2F1. The nF2 frequency component then spectrally folds and coincides with the region of nF2−2F1.

Conventional systems such as is disclosed in U.S. Pat. No. 6,522,121, issued Feb. 18, 2003, the disclosure of which is incorporated by reference in its entirety herein, describes a configuration of anti-aliasing filters and sample rate that generally prevents signal distortions. For example, a multiple digital filter with a narrow passband is typically used to address this problem. However, conventional methods fail to detect and connect or to prevent alleviate distorted signals that occur when the IMD or spurious frequencies are folded due to the sample rate of the analog digital converter coinciding with the signal of interest in the passband region of the digital filter. It is therefore desirable to have a method and a system that addresses these problems.

SUMMARY

One embodiment of the present invention is directed to a control module that prevents distorted signals. The control module includes a plurality of analog to digital converters (A/D converters) and a symmetric phase controller coupled to the plurality of A/D converters. The symmetric phase controller generates a plurality of phase-shifted A/D sampling clock signals to the plurality of A/D converters. The plurality of A/D converters then output data to a multiplexer. The multiplexer interleaves the data from the plurality of A/D converters.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present teaching will become more fully understood from the detailed description and the accompanying drawings, wherein:

FIG. 1 is an example radio frequency spectrum for a dual frequency RF power generation system;

FIGS. 2A-2B are block diagrams that depict intermodulation distortion (IMD) regions around a fundamental frequency bandwidth (BW) generated by a dual frequency RF power generation system;

FIGS. 3A-3B are block diagrams that depict IMD regions around an aliased bandwidth frequency generated by a dual frequency RF power generation system;

FIG. 4 is a block diagram that depicts IMD regions and an aliased bandwidth with an interference region adjacent to the Nyquist frequency;

FIG. 5 is a block diagram of a RF metrology system;

DETAILED DESCRIPTION

Figure 6A:
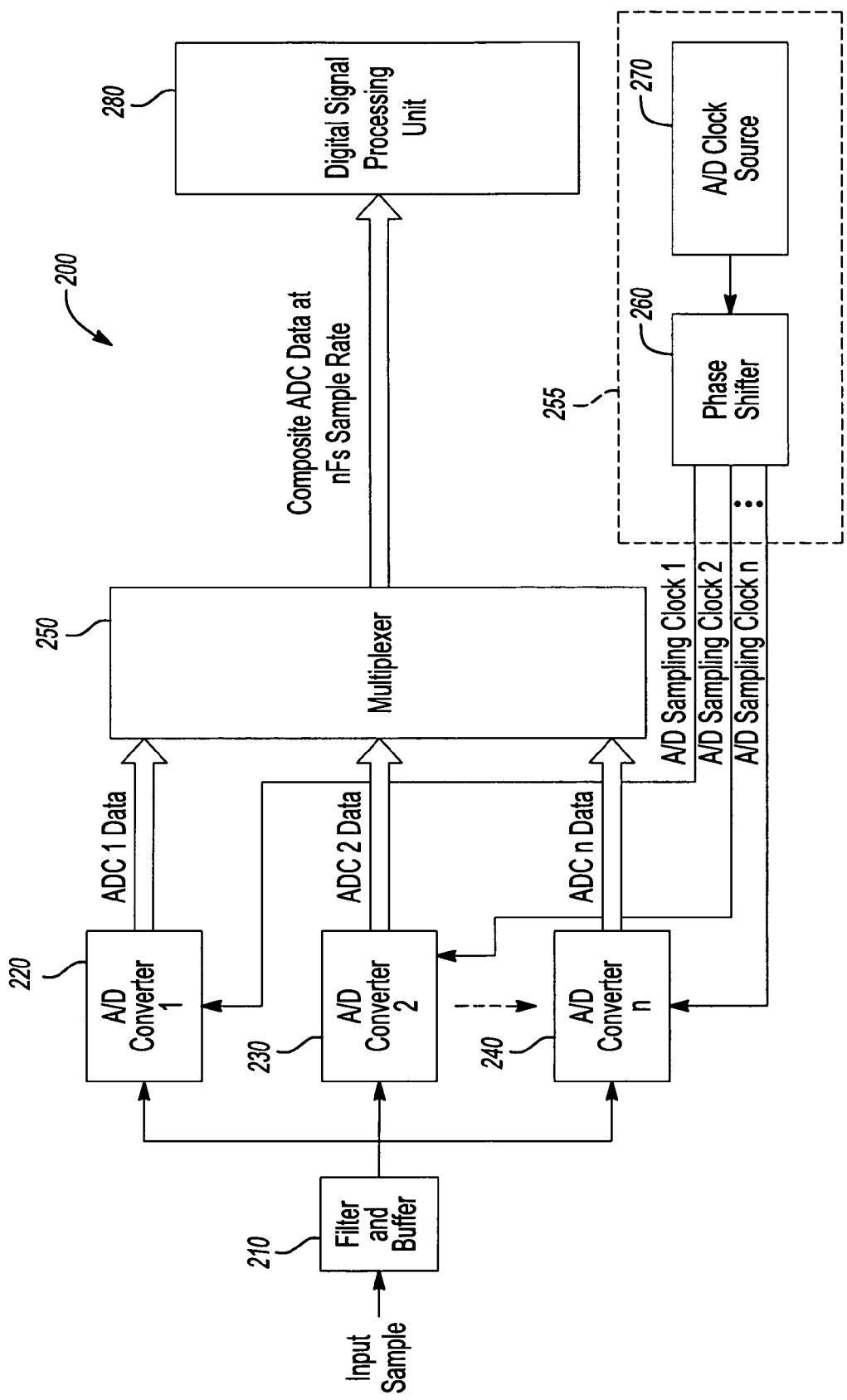
FIG. 6A is a block diagram of a broadband sampling unit in accordance with some embodiments.

The following description of the various embodiments is merely exemplary in nature and is in no way intended to limit the present teaching, application, or uses. For purposes of clarity, the similar reference numbers are used in the drawings to identify similar elements.

Generally, the present application is directed to detect and correct distorted signals that result from aliasing of frequencies. Some embodiments employ clock synchronization of multiple analog to digital converters (A/D converters) to prevent corruption of radio frequency (RF) measurements due to spurious frequency interference. Some embodiments detect and correct for spurious frequency interference by changing the sample rate of the A/D converters. Some embodiments detect and correct for spurious frequency interference through mathematical manipulation of vectors.

Referring now to FIG. 5, a RF metrology system 10 monitors the amount of power delivered to a plasma chamber (not shown). RF metrology system 10 includes a probe head 12 and a probe analysis system 20. Generally, probe head 12 generates an analog voltage signal 28 and an analog current signal 30 based on the radio frequency (RF) power supplied to the plasma chamber (not shown) by the power delivery system (not shown). A voltage sensing board 16 monitors the RF voltage, whereas a current sensing board 18 monitors the RF current. Probe analysis system 20 generates digital spectrum signals, digital magnitude signals, and digital phase signals, as needed by the power delivery system for closed loop control.

FIG. 6A depicts a block diagram of probe analysis system 200 that can be employed in RF metrology system 10 of FIG. 5. Generally, probe analysis system 200 symmetrically controls a phase of a sampling A/D clock applied to a plurality of A/D converters 220, 230, 240 to yield a higher sample rate when the digital data is interleaved. Probe analysis system 200 includes a filter and buffer 210, analog to digital (A/D) converters 220, 230, 240, phase controller 255, multiplexer (MUX) 250, and digital processing unit 280. An input sample signal is input to filter and buffer 210. Filter and buffer 210 performs several functions. For example, filter and buffer 210 can include a low pass filter to suppress higher frequencies. Typically, an anti-aliasing filter is used as the low pass filter. An anti-aliasing filter generally has a bandwidth of (Fs/2) to suppress higher frequencies, where Fs is the sample frequency in Hertz (Hz). Filter and buffer 210 also isolate and provide the necessary impedance to match the wideband application of the plurality of A/D converters 220, 230, 240. The filtered and buffered signal is input to a plurality of A/D converters 220, 230, 240. A/D converters 220, 230, 240 convert analog input signals to digital signals.

Phase controller 255 controls the phase shift of the A/D sampling clocks 1, 2, and n. The sampling clocks trigger the sampling of A/D converters 220, 230, 240 at every rising edge. Phase controller 255 includes A/D converter clock source 270 and phase shifter 260. A/D converter clock source 270 outputs a clock signal to phase shifter 260, which can be implemented in either analog or digital circuitry. Phase shifter 260 changes the transmission phase angle of the clock signals. The phase shift indicates the difference between corresponding points on input and output signal waveforms expressed as degrees lead or lag.

Figure 6B:
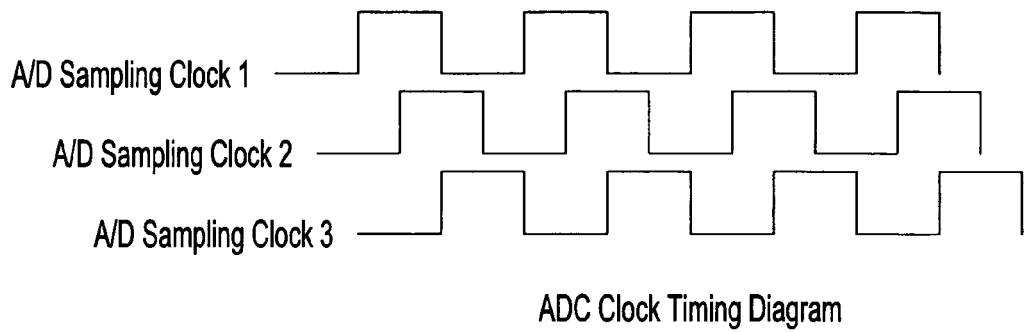
FIG. 6B is a timing diagram for the broadband sampling unit of FIG. 6A.

The timing diagram depicted in FIG. 6B depicts the phase shift between A/D sampling clock signals 1, 2, and n input the plurality of A/D converters 220, 230, and 240, respectively. A/D sampling clock signal 2 input to A/D converter 220 has a phase shift of 0°. A/D sampling clock signal 2 input to A/D converter 230 is phase shifted by 120°. A/D sampling clock signal n input to A/D converter 240 is phase shifted 240°. Symmetrically phase shifting the A/D sampling clocks increases the sample rate of data by, in this example, three times over the sample rate provided by any one of the A/D converters 220, 230, 240. The data output by each A/D converter 220, 230, and 240 is clocked at the same sample rate, but is phase shifted by 120° in the embodiment described herein.

Data output from A/D converters 220, 230 and 240 is input to multiplexer 250, where M is interleaved. In some embodiments, multiplexer (MUX) 250 interleaves data from A/D converters 220, 230 and 240. One skilled in the art will recognize that other methods of interleaving data may also be used. The outputs from A/D converters 220, 230, 240 form a composite A/D converter at a nFs sample rate, where n is the number of A/D converters, which is generated from MUX 250 and input to digital processing unit 280. As shown in FIG. 6A, the analog/digital composite (ADC) data at an nFs sample rate includes interleaved data ADC 1 data, ADC 2 data, and ADC n data. This method to prevent signal distortion can be implemented with any two or more A/D converters, with the phase shift of each A/D converter being 360/N, where N is the number of A/D converters.

Figure 6C:
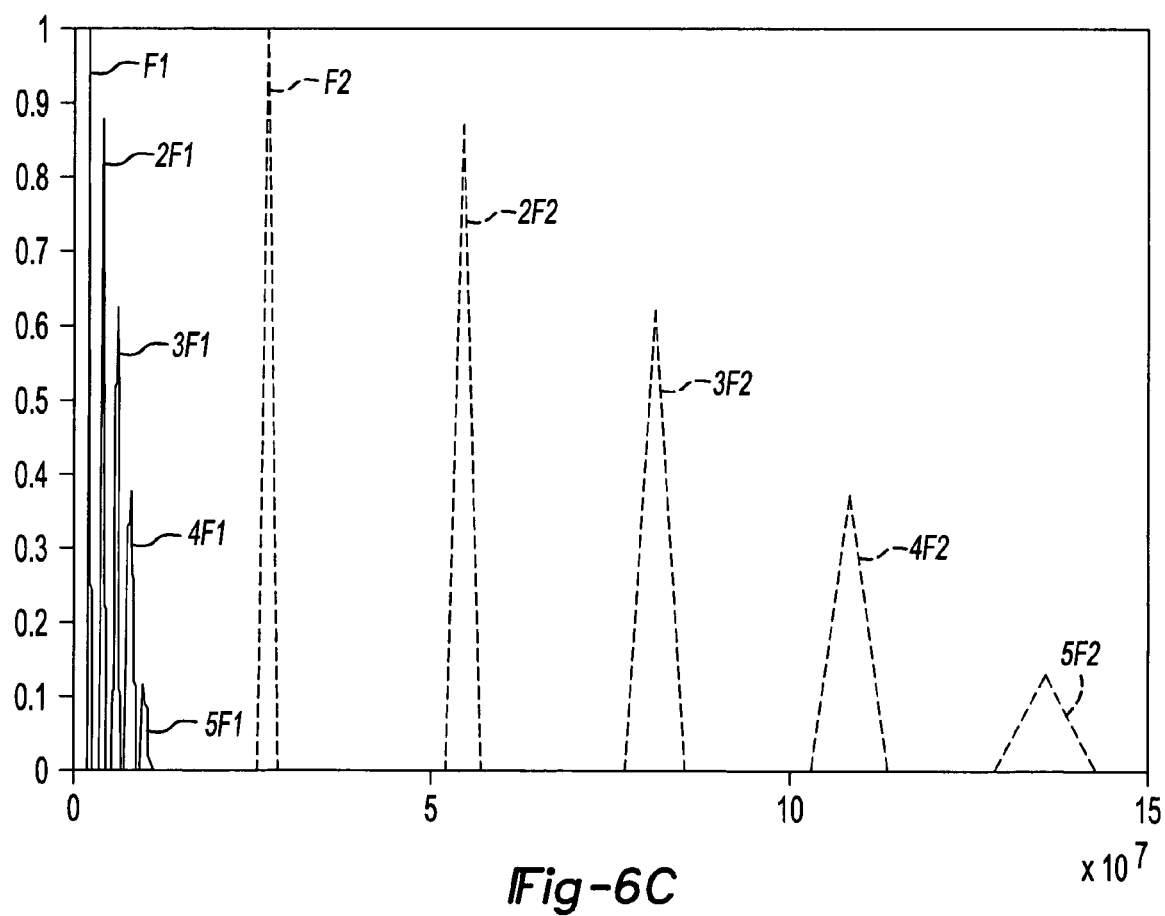
FIG. 6C is a digital spectrum for the broadband sampling unit of FIG. 6A.

Digital spectral plot in FIG. 6C represents the spectral plot of FIG. 1 with three times the A/D converter sample rate achieved using the clock synchronization of multiple A/D converters 220, 230, and 240 of FIG. 6A. By visual inspection of the digital spectrum in FIG. 6C, it is apparent that none of the frequency bands (F1, 2F1, 3F1, 4F1, 5F1 or F2, 2F2, 3F2, 4F2, 5F2) spectrally fold. Further, spurious frequencies contained in the input signal bandwidth do not interfere with the frequency bands of interest. This increased sample rate prevents distortion of signals of interest that result from spectral folding.

Various embodiments of the present invention relate to detection and correction of spurious frequency. In some embodiments, probe analysis system 20 depicted in FIG. 7A may be implemented in closed loop control system 10 of FIG. 1. Generally, probe analysis system 20 includes broadband sampling unit 22 and digital processing unit 24. Sampling unit 22 generates digital power signals 26a, 26b based on a plurality of analog signals 28, 30. Analog signals 28, 30 characterize power delivered from a RF power delivery system (not shown) to a plasma chamber (not shown) and can respectively represent voltage and current or forward and reflected power. Digital processing unit 24 generates a digital spectrum signal based on the digital power signals 26. Digital magnitude signals and digital phase signals can also be generated. Sampling unit 22 simultaneously samples a first plurality of frequencies from the analog signals 28, 30 such that the digital spectrum signal defines signal levels for the first plurality of frequencies.

Analog signals 28, 30 include an analog voltage signal 28 and analog current signal 30. Sampling unit 22 includes first filtering module 32 for band limiting the analog voltage signal 28 and the analog current signal 30 to a first predetermined bandwidth. The first predetermined bandwidth includes a first plurality of frequencies. For example, the first predetermined bandwidth may include the fundamental frequency of 2 MHz and the harmonics of the fundamental frequency range up to 10 MHz. A primary A/D converter 34 is coupled to filtering module 32, and the primary A/D converter 34 generates a first digital voltage signal 26a ($V_{LF}$) based on the analog voltage signal 28. Primary A/D converter 34 also generates a first digital current signal 26b ($I_{LF}$) based on the analog current signal 30. First digital voltage signal 26a and first digital current signal 26b therefore define the digital power signals. Coupled to both A/D converters 34 and 48 is A/D converter sample rate difference controller 300.

Figure 7A:
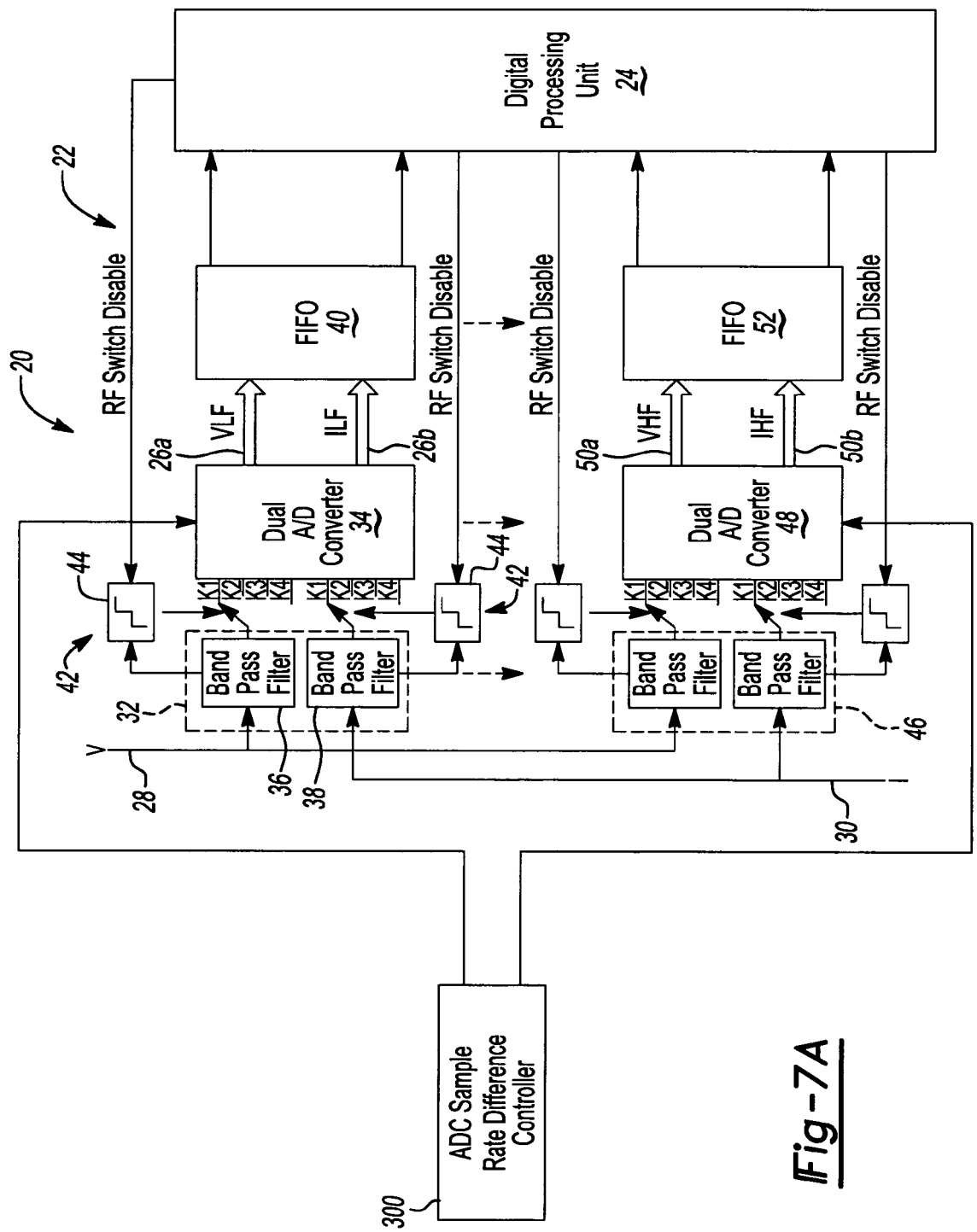
FIG. 7A is a block diagram illustrating a broadband sampling processing unit in accordance with some embodiments.
Figure 7B:
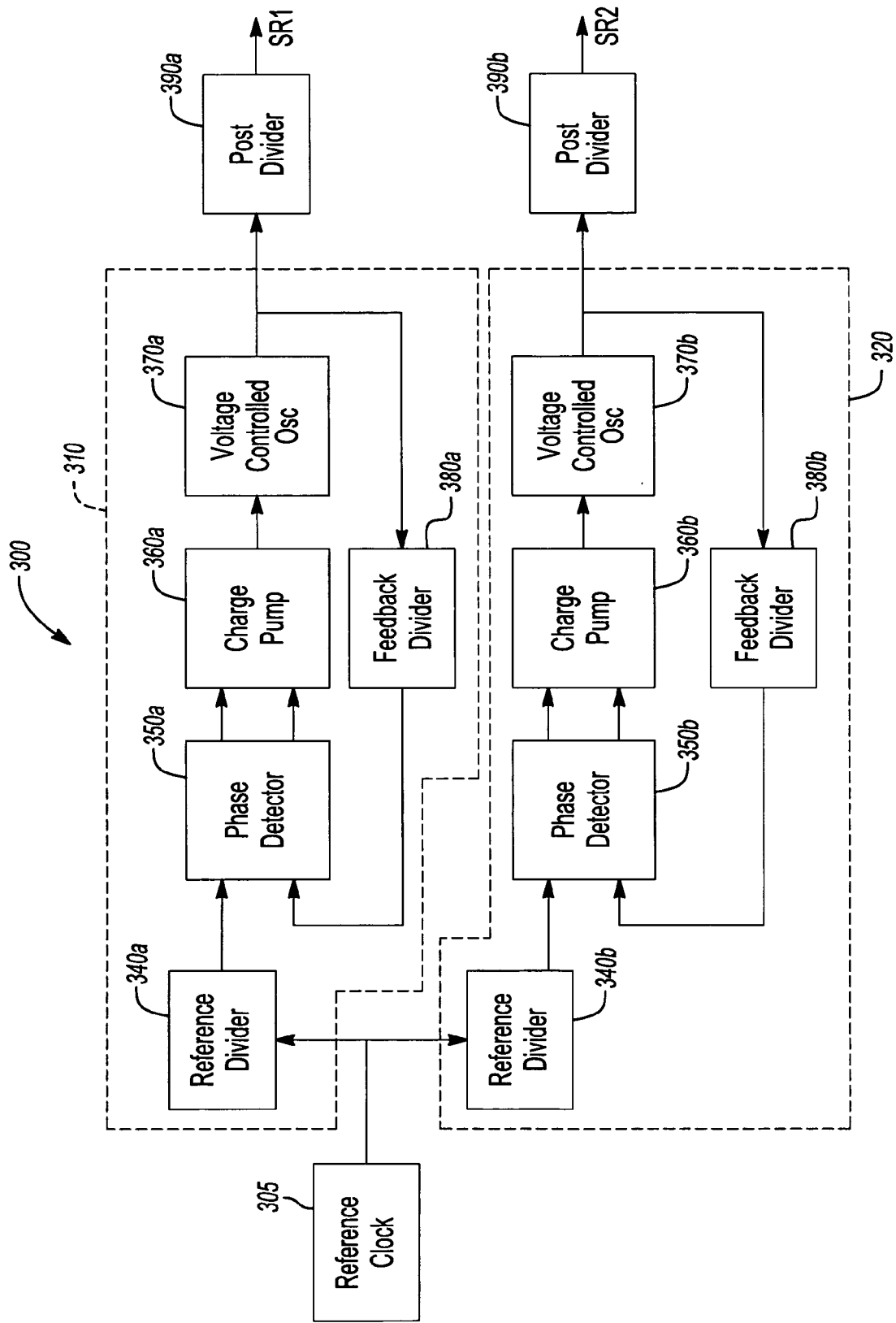
FIG. 7B is a block diagram of an analog to digital (A/D) converter sample rate difference controller as applied to the broadband sampling unit of FIG. 7A.

A/D converter sample rate difference controller 300, depicted in greater detail in FIG. 7B, controls an oscillator to maintain a constant phase angle (i.e., lock) on the frequency of an input or reference signal for each dual (or greater) A/D converter 34, 48. In particular, the sample rates of the clocks for the dual A/D converters 34, 48 are frequency locked. The A/D converter sample rate difference controller 300 may also be used to generate, modulate, and demodulate a signal and to divide a frequency. A/D converter sample rate difference controller 300 includes first and second mixed-signal phase-lock loops (PLLs) 310, 320 connected to a reference clock 305. First PLL 310 outputs sample rate one (SR1) and second PLL 320 outputs sample rate two (SR2) to A/D converters 34, 48. First PLL 310 will be described herein. One skilled in the art will recognize that second PLL 320 operates similarly.

First PLL 310 includes a reference divider 340a, a phase detector 350a, a charge pump 360a, a voltage controlled oscillator (VCO) 370a, and a feedback divider 380a. Reference divider 340a receives the output of the reference clock 305 and provides a divided-down frequency to phase detector 350a. During operation, the reference frequency is first divided by the reference divider 340a. The reference divider 340a value is referred to as the modulus. The divided reference frequency is then input into phase detector 350a. The output of VCO 370a is fed back to the phase detector 350a via feedback divider 380a to close the phase-lock loop. Phase detector 350a controls the operating speed of VCO 370a via charge pump 360a. Phase detector 350a drives the VCO 370a up or down in frequency until the divided reference frequency and the divided VCO frequency appearing at the input of phase detector 350a are equal. VCO 370a provides a low-noise, continuously variable high frequency clock source for the PLL 310. Post divider 390a can be added to the PLL 310 output for additional flexibility. The discussion now turns to the detection and correction of signal distortion.

Figure 8:
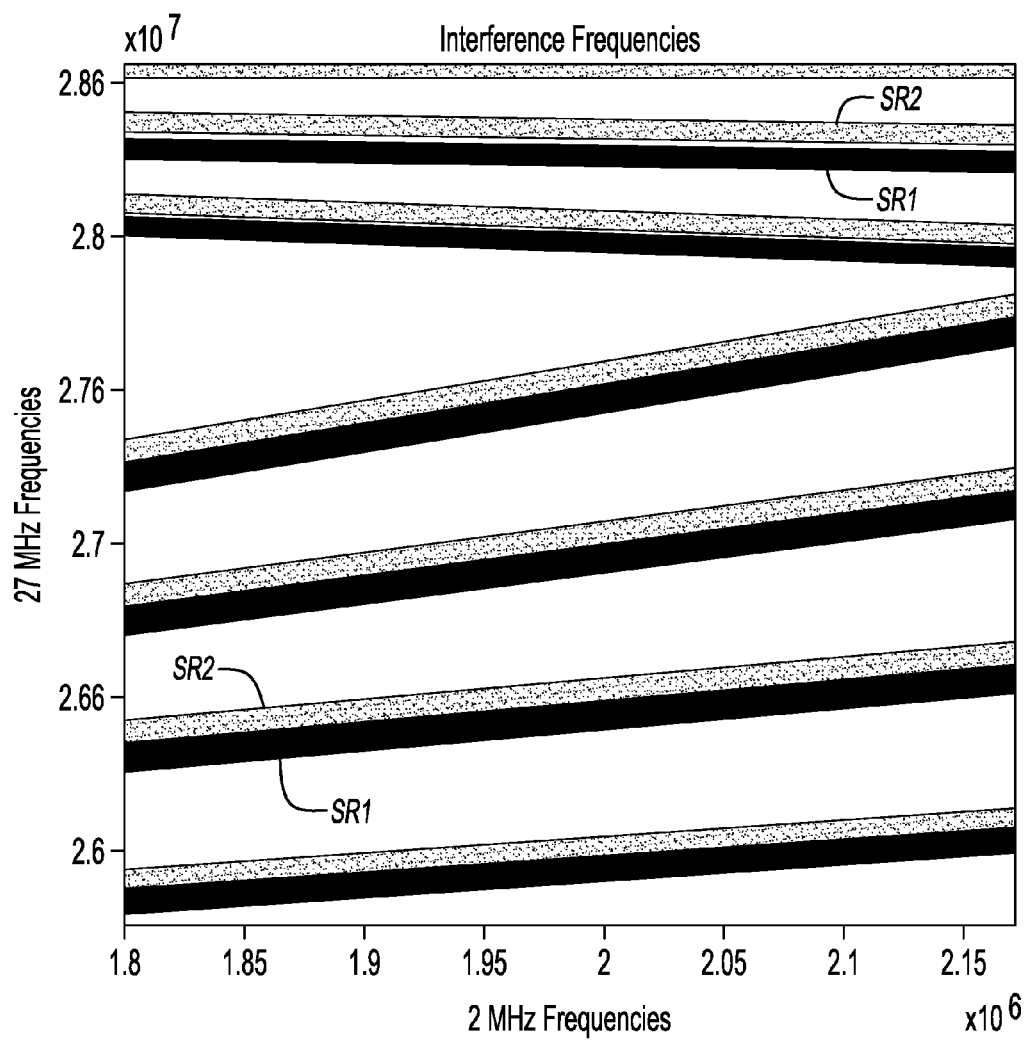
FIG. 8 is a graph that depicts interference regions for A/D converter sample rate curves generated by the broadband sampling unit of FIG. 7A.

When IMD is detected, ADC sample rate correction occurs by shifting between the sample rates of the dual A/D converters 34, 48 of probe analysis system 20 in FIG. 7A. To determine the most appropriate sample rate to be used, the in-band interference regions shown in FIG. 8 are determined. FIG. 8 identifies the frequencies of each RF source when an interference region occurs for sample rate one (SR1) and sample rate two (SR2). Frequency SR1 appears as a lighter shading, and frequency SR2 appears as a darker shading. As shown in FIG. 8, in some instances, the boundaries for the two sampling rates are shared. This occurs when the difference between SR1 and SR2 exceeds the bandpass filter region of the digital filter. For example, if the bandwidth of the digital filter is ±125 KHz, the difference SR2 must be greater than 250 KHz or less than 250 KHz to meet the minimum design criteria. The frequency difference between SR1 and SR2 is controlled by A/D converter sample rate difference controller 300.

There are two methods to detect the in-band interference for the three scenarios depicted in FIGS. 2A-2B, 3A-3B, and 4. The first method identifies the boundaries of the interference regions or bands for each sample rate (SR) of each A/D converter 34, 48. To determine the interference bands, several operations are performed by a control panel (not shown) of probe analysis 20.

Figure 9:
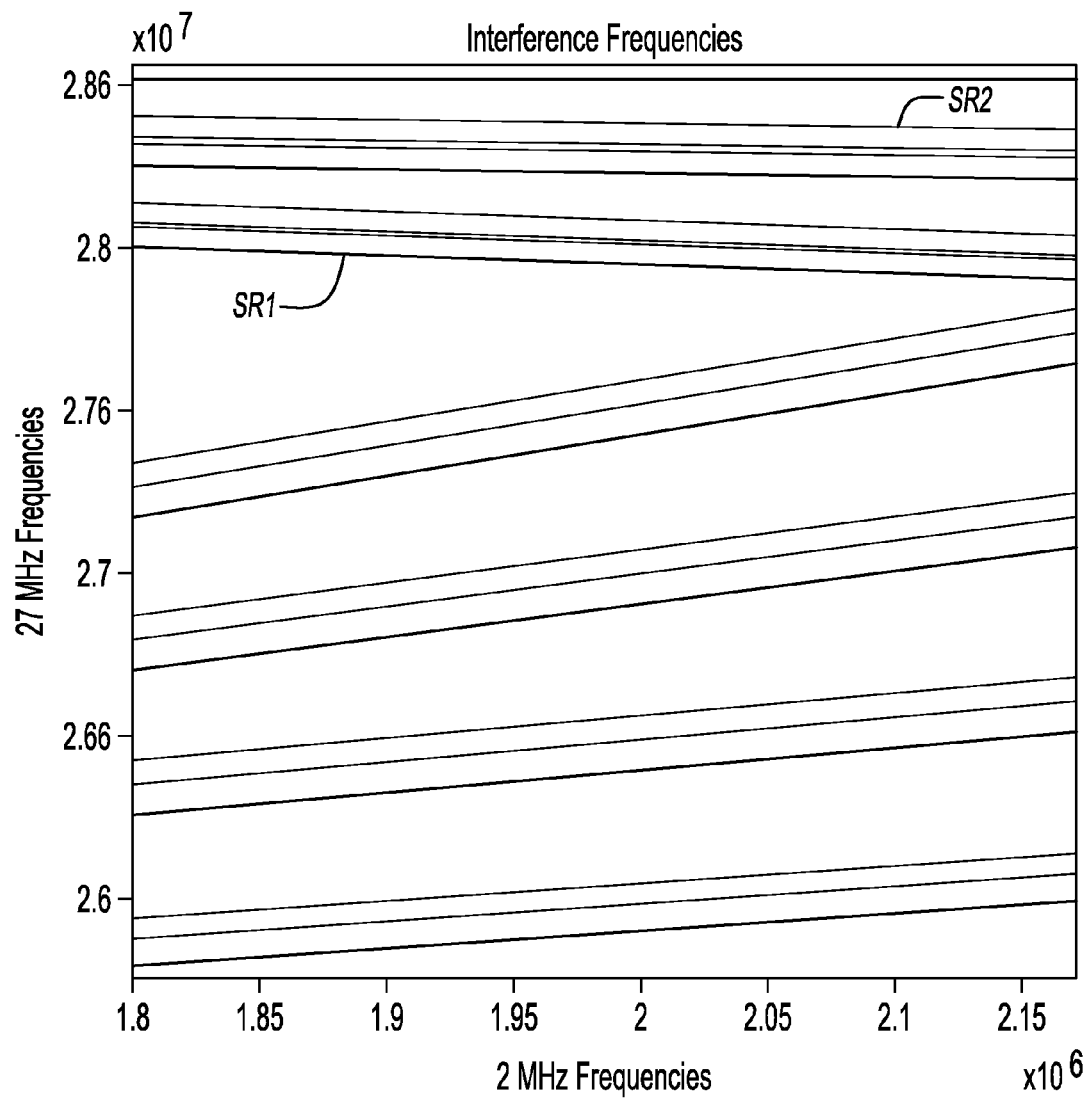
FIG. 9 is a graph of the boundaries of the interference regions for the broadband sampling unit of FIG. 7A.

FIG. 9 shows the boundaries for the interference regions of FIG. 8. Each boundary region can be described by a linear equation that is a function of the RF frequencies F1 and F2. In some embodiments, a least squares method can be used to generate these equations. When a boundary crossover is identified, a switch is made from SR1 to SR2, or vice versa. This method results in a matrix of equations for selecting one of the two sample rates.

Figure 10:
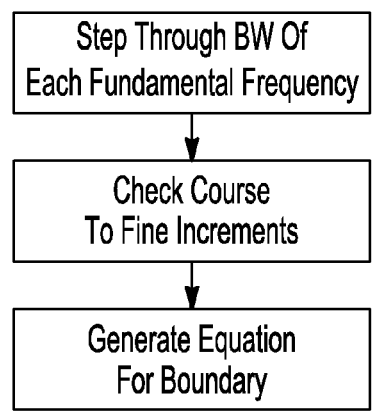
FIG. 10 is a flow diagram for determining interference regions.

The boundaries of the interference band can be determined as described in FIG. 10. As shown at step 310, first review the bandwidths of each fundamental RF source as shown at step 310. As shown at step 320, the analysis transitions from utilizing coarse to fine increments to expedite a search through the bandwidths. Step 310 increases the resolution of the increment to precisely identify the points of the lines that define each interference band. Based on the outer points, use the least squares method, by way of example, to generate an equation for the line, as shown at step 330.

The second method detects the in-band interference for the three cases described in FIGS. 2A-2B, 3A-3B, and 4 by generating equations that define each occurrence for an A/D sample rate change. This method includes the same operations previously described in connection with the control panel (not shown) except the sample rate is used in place of interference regions. Only new equations are added to a matrix of equations. Repeated equations are eliminated. With respect to correcting the first case of band interference depicted in FIGS. 2A-2B, the equations that are generated are provided as follows for each harmonic:

| Third harmonic interference | Fifth harmonic interference |
|---|---|
| Fs = 4F2 − 2F1 | Fs = 4F2 − 1F1 |
| Fs = 4F2 − 3F1 | Fs = 4F2 − 2F1 |
| Fs = 4F2 − 4F1 | Fs = 4F2 − 3F1 |
| Fs = 4F2 − 5F1 | Fs = 4F2 − 4F1 |
| Fs = 3.5F2 +0.5F1 | Fs = 4F2 − 5F1 |
| Fs = 3.5F2 +F1 | Fs = 3.5F2 + 0.5F1 |
| Fs = 3.5F2 +F1 | |

With respect to correcting the second case of band interference, the applicable equations are as follows:

Fourth harmonic interference $Fs=3.5F2+0.5F1$ $Fs=3.5F2+F1$

With respect to correcting the third case of band interference, the applicable equations are as follows:

Second harmonic interference $Fs=4F2-2F1$ $Fs=3.5F2+0.5F1$ $Fs=3.5F2+F1$

Due to the repetition of a number of equations, the equations are consolidated to a matrix containing the unique equations that were found, which are as follows:

$Fs=3.5F2+0.5F1$ $Fs=3.5F2+F1$ $Fs=4F2-nF1$; where $n=1.5$

Figure 11:
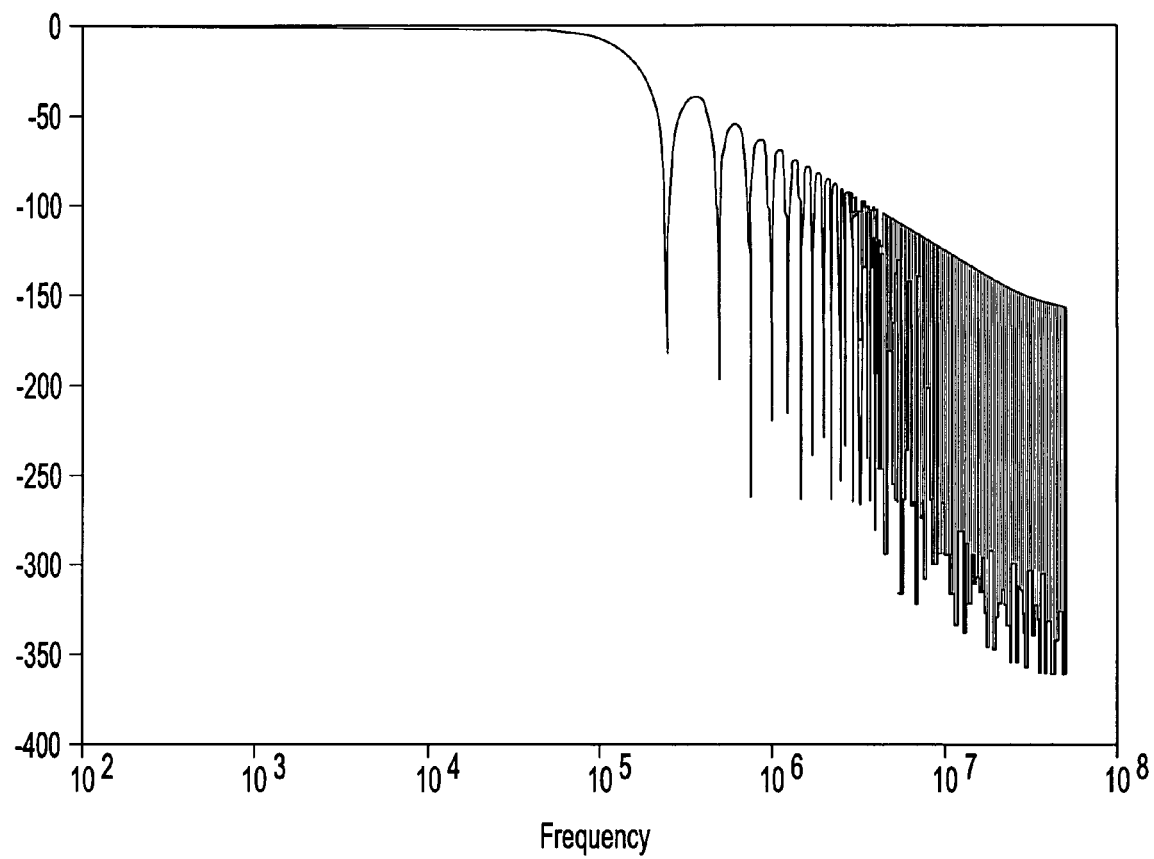
FIG. 11 is a graph of a frequency response for a multirate digital filter.

False positives may be generated with this procedure. False positives are independently verified using conventional mathematical methods. An interference region is detected when a derived Fs for a given F1 and F2 is less than or equal to the passband region of a digital filter illustrated in FIG. 11. Both methods may be generalized for any combination of RF source bandwidth and any number of RF sources.

The third embodiment detects and corrects spurious frequency interference through mathematical manipulation of vector correction. Correcting the amplitude modulation that results from an in-band signal distortion is achieved, in part, by subtracting the maximum peak from the average magnitude of the input signal.

Figure 12:
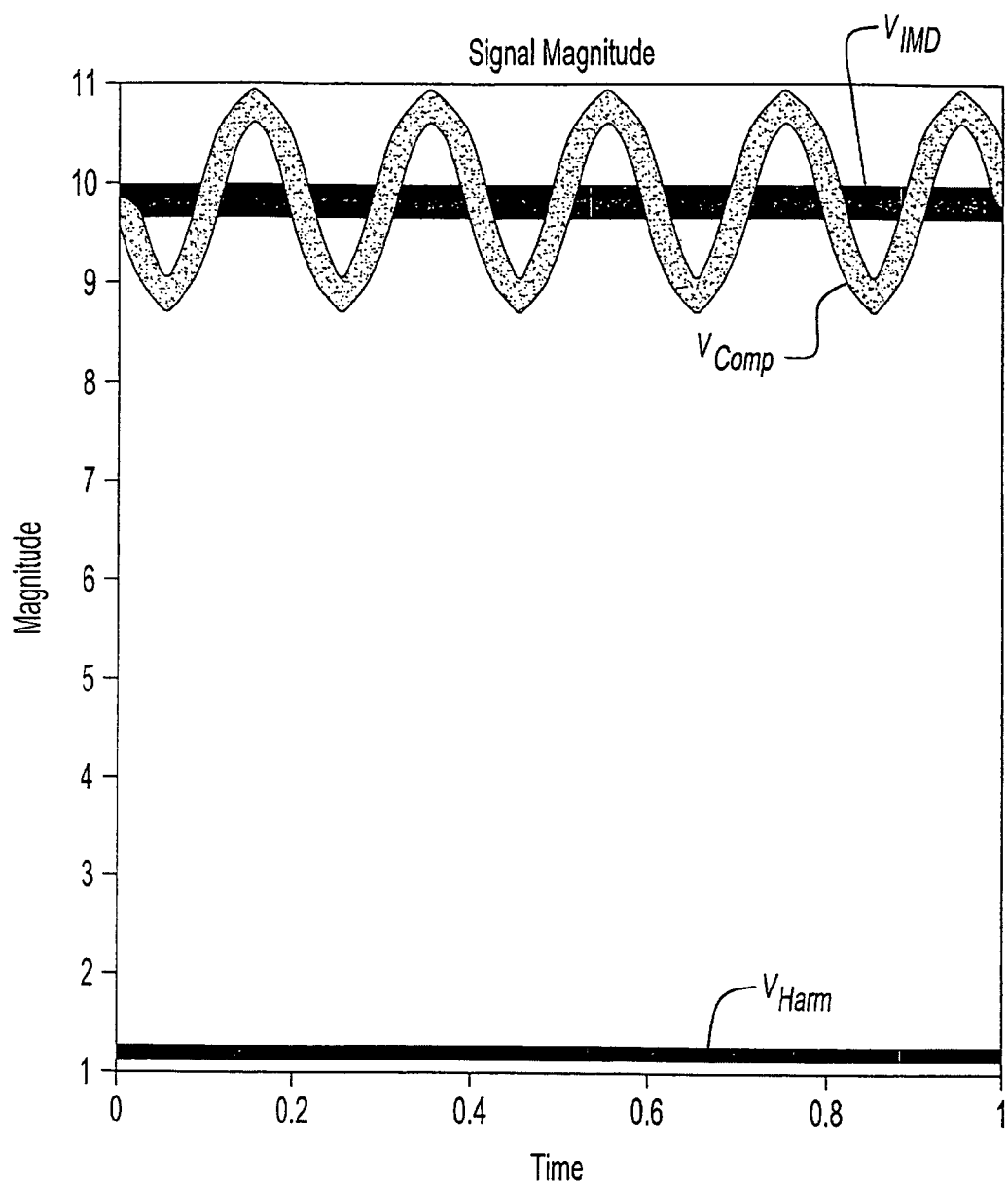
FIG. 12 is a graph of vector correction as applied to amplitude correction for the broadband sampling unit of FIG. 7A.

As shown in FIG. 12, the difference between the maximum peak and the average magnitude of the input signal resolves the magnitude distortion. In FIG. 12, the line $V_{IMD}$ represents the IMD product that coincides with the signal of interest, $V_{HARM}$, in the pass band region of the digital filter of FIG. 11. A composite signal, $V_{COMP}$, is formed by these two signals. By visual inspection, it is apparent that the peak of $V_{COMP}$ with respect to the $V_{IMD}$ signal is equal to the magnitude of the signal of interest, $V_{HARM}$. The phase is similarly corrected through sample rate correction. The phasor rotates while the magnitude cycles over a constant amplitude and justifies the point-by-point correction whereas the magnitude is corrected by taking an average.

Those skilled in the art can now appreciate from the foregoing description that the broad teachings of the present invention can be implemented in a variety of forms. Therefore, while this invention can be described in connection with particular examples thereof, the true scope of the invention should not be so limited since other modifications will become apparent to the skilled practitioner upon a study of the drawings, specification and following claims.

The invention claimed is:

1. A method for alleviating distorted signals in a nonlinear system, comprising:
    sampling a reference signal at a plurality of sample rates to obtain a plurality of sampled reference signals, wherein the reference signal varies in accordance with a reference clock and wherein the reference signal is limited to a predetermined frequency bandwidth prior to sampling;
    selecting a particular one of the plurality of sampled reference signals in order to eliminate spurious frequency interference;
    switching between the plurality of sampled reference signals when a boundary crossover between interference regions of the plurality of sample rates is detected; and
    determining interference regions in the plurality of sample rates.

2. The method of claim 1, further comprising generating a plurality of equations for each of the plurality of sample rates based upon the interference regions.

3. The method of claim 2, further comprising eliminating repeated equations from the plurality of equations.

4. A control module comprising:
    an A/D converter sample rate difference controller that generates a plurality of sample rate frequencies, wherein the sample rate frequencies vary in accordance with at least one reference clock;
    a plurality of A/D converters, each of which receives a reference signal and a selected one of the plurality of sample rate frequencies and outputs a converted reference signal, wherein the converted reference signal comprises the reference signal sampled at the one of the plurality of sample rate frequencies;
    a digital processing module that receives each of the converted reference signals and selects one of the converted reference signals to output in order to eliminate spurious frequency interference; and
    a filtering module that limits the reference signal to a predetermined frequency bandwidth;
    wherein the digital processing module switches which of the converted reference signals is selected when a boundary crossover between interference regions of the plurality of sample rate frequencies is detected; and
    wherein the digital processing module determines interference regions in the plurality of sample rate frequencies.

5. The control module of claim 4, wherein the digital processing module generates a plurality of equations for each of the plurality of sample rate frequencies based upon the interference regions.

6. The control module of claim 5, wherein the digital processing module eliminates repeated equations from the plurality of equations.

\* \* \* \* \*